(12) United States Patent
Acuña et al.

(10) Patent No.: US 7,480,877 B2
(45) Date of Patent: Jan. 20, 2009

(54) METHODS AND APPARATUS FOR BOOLEAN EQUIVALENCY CHECKING IN THE PRESENCE OF VOTING LOGIC

(75) Inventors: Victor A. Acuña, Rochester, MN (US); Robert L. Kanzelman, Rochester, MN (US); Scott H. Mack, Rochester, MN (US); Brian C. Wilson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 199 days.

(21) Appl. No.: 11/463,958

(22) Filed: Aug. 11, 2006

(65) Prior Publication Data

US 2008/0040694 A1    Feb. 14, 2008

(51) Int. Cl.
*G06F 17/50* (2006.01)

(52) U.S. Cl. .............................................. 716/4; 716/6
(58) Field of Classification Search .................. 716/4–6
See application file for complete search history.

(56) References Cited

U.S. PATENT DOCUMENTS 6,931,611 B2 *  8/2005  Martin et al. ................... 716/5
7,210,109 B2 *  4/2007  Caron et al. ................... 716/4

* cited by examiner

*Primary Examiner*—Jack Chiang
*Assistant Examiner*—Binh C Tat
(74) *Attorney, Agent, or Firm*—Dugan & Dugan, PC

(57) ABSTRACT

In a first aspect, a first method of designing a circuit is provided. The first method includes the steps of (1) providing a model of an original circuit design including a latch; (2) providing a model of a modified version of the original circuit design, wherein the modified version of the original circuit design includes a set of latches associated with the latch of the original circuit design and voting logic having inputs coupled to respective outputs of latches in the latch set; and (3) during Boolean equivalency checking (BEC), injecting an error on at most a largest minority of the inputs of the voting logic to test the voting logic function.

8 Claims, 9 Drawing Sheets

METHODS AND APPARATUS FOR BOOLEAN EQUIVALENCY CHECKING IN THE PRESENCE OF VOTING LOGIC

FIELD OF THE INVENTION

The present invention relates generally to integrated circuits, and more particularly to methods and apparatus for Boolean equivalency checking in the presence of voting logic.

BACKGROUND

During a circuit design process, a circuit designer may create an original circuit design, which may be modeled using Very High Speed Integrated Circuit (VHSIC) Hardware Description Language (VHDL), Verilog or another suitable language. The original circuit design may be changed during the circuit design process. For example, a modified circuit design may increase reliability of the original circuit design by replacing each significant latch (e.g., a latch which drives a downstream logic value) with a plurality of latches, such as a three-latch latch set, thereby adding redundancy to the modified circuit design. The modified circuit design may also include voting or majority logic coupled to the latch set to ensure a majority value output from the latches of the latch set serves as the output of the latch set. Circuit design modifications such as this are often done to mitigate the effects of single event upsets (SEU's) that may occur in circuit designs without such modification. While designing the modified circuit, the modified circuit may be tested using modeling.

Boolean equivalency checking (BEC), also known as combinational equivalency checking, is a process employing formal mathematical methods to ensure that the modified circuit design is identical in function to the original circuit design. As a first phase of BEC between the two circuit designs, correspondence or mapping is performed. During mapping, corresponding logic cones are identified for the two circuit designs, respectively. Each logic cone may describe combinational logic having a plurality of inputs and an output. However, traditional correspondence or mapping may not enable accurate BEC. For example, traditional mapping of the modified circuit design that includes a three-latch latch set, may map each latch of the three-latch latch set to the corresponding latch in the original circuit design. Such a mapping causes each latch of the latch set to be treated as storing the same value (e.g., the value output from the corresponding latch in the original circuit design). Therefore, if such a traditional mapping is employed (without further modification of the modified circuit design model), BEC may be unable to detect errors within the voting logic, as the voting logic is never required to resolve a logic value from the latch set when errors are present within the latch set resulting from SEU's. Accordingly, improved methods and apparatus for BEC are desired.

SUMMARY OF THE INVENTION

In a first aspect of the invention, a first method of designing a circuit is provided. The first method includes the steps of (1) providing a model of an original circuit design including a latch; (2) providing a model of a modified version of the original circuit design, wherein the modified version of the original circuit design includes a set of N latches associated with the latch of the original circuit design and voting logic having inputs coupled to respective outputs of latches in the latch set, where N is an odd number; and (3) during Boolean equivalency checking (BEC), injecting an error on at most $(N-1)/2$ of the inputs of the voting logic to test the voting logic function.

In a second aspect of the invention, a second method of designing a circuit is provided. The second method includes the steps of (1) creating a model of an original circuit design including a latch; (2) creating a primary model of a modified version of the original circuit design, wherein the modified version of the original circuit design includes a set of N latches associated with the latch of the original circuit design and voting logic having inputs coupled to respective outputs of latches in the latch set, where N is an odd number; (3) determining subsets of the set of latches, wherein each subset is a unique group of M latches, where M is the integer value of N/2; (4) for each of the subsets, creating a sub-model of the primary model in which all N latches except for the subset are associated with the latch of the original circuit design and in which voting logic has inputs coupled to respective outputs of the N latches; and (5) executing the BEC tool for each sub-model to test the voting logic function.

In a third aspect of the invention, a first apparatus for designing a circuit is provided. The first apparatus is a computer including (1) a memory; (2) improved Boolean equivalency checking (BEC) code stored in the memory; and (3) a processor coupled to the memory and adapted to execute the improved BEC code. The improved BEC code is adapted to (a) receive a model of an original circuit design including a latch; (b) receive a model of a modified version of the original circuit design, wherein the modified version of the original circuit design includes a set of N latches associated with the latch of the original circuit design and voting logic having inputs coupled to respective outputs of latches in the latch set, where N is an odd number; and (c) during Boolean equivalency checking (BEC), inject an error on at most $(N-1)/2$ of the respective inputs of the voting logic to test the voting logic function.

In a fourth aspect of the invention, a second apparatus for designing a circuit is provided. The second apparatus is a computer including (1) a memory; (2) improved Boolean equivalency checking (BEC) code stored in the memory; and (3) a processor coupled to the memory and adapted to execute the improved BEC code. The improved BEC code is adapted to (a) receive a model of an original circuit design including a latch; (b) receive a primary model of a modified version of the original circuit design, wherein the modified version of the original circuit design includes a set of N latches associated with the latch of the original circuit design and voting logic having inputs coupled to respective outputs of latches in the latch set, where N is an odd number; (c) determine subsets of the set of latches, wherein each subset is a unique group of M latches, where M is the integer value of N/2; (d) for each of the subsets, create a sub-model of the primary model in which all N latches except for the subset are associated with the latch of the original circuit design and in which voting logic has inputs coupled to respective outputs of the N latches; and (e) execute the BEC tool for each sub-model to test the voting logic function.

In a fifth aspect of the invention, a first computer program product for designing a circuit is provided. The first computer program product includes a medium readable by a computer, the computer readable medium having computer program code adapted to (1) receive a model of an original circuit design including a latch; (2) receive a model of a modified version of the original circuit design, wherein the modified version of the original circuit design includes a set of N latches associated with the latch of the original circuit design and voting logic having inputs coupled to respective outputs of latches in the latch set, where N is an odd number; and (3) during Boolean equivalency checking (BEC), inject an error on at most (N−1)/2 of the respective inputs of the voting logic to test the voting logic function.

In a sixth aspect of the invention, a second computer program product for designing a circuit is provided. The second computer program product includes a medium readable by a computer, the computer readable medium having computer program code adapted to (a) receive a model of an original circuit design including a latch; (b) receive a primary model of a modified version of the original circuit design, wherein the modified version of the original circuit design includes a set of N latches associated with the latch of the original circuit design and voting logic having inputs coupled to respective outputs of latches in the latch set, where N is an odd number; (c) determine subsets of the set of latches, wherein each subset is a unique group of M latches, where M is the integer value of N/2; (d) for each of the subsets, create a sub-model of the primary model in which all N latches except for the subset are associated with the latch of the original circuit design and in which voting logic has inputs coupled to respective outputs of the N latches; and (e) execute the BEC tool for each sub-model to test the voting logic function. Numerous other aspects are provided, as are systems, apparatus and computer program products in accordance with these other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

The present invention provides improved methods and apparatus for BEC. In a first embodiment, the present invention provides first methods and apparatus to overcome the above-described problem introduced by the traditional mapping. More specifically, the present invention provides error injection logic in a model of a circuit design modified to include the redundancy (e.g., latch redundancy) described above. The error injection logic may be coupled to outputs of the latches in the latch set and inputs of the voting logic. The error injection logic may be employed during the execution of the BEC tool to inject an error on at most a largest minority of the inputs to the voting logic. By detecting a value output from the voting logic or from other logic downstream from the voting logic, the BEC tool may determine whether the voting logic in the modified circuit design functions properly. In this manner, the first embodiment may overcome the above-described problem introduced by the traditional mapping.

In a second embodiment, the present invention provides methods and apparatus to overcome the above-described problem introduced by the traditional mapping. More specifically, the present invention may perform a plurality of BEC tool executions using different versions of the modified circuit design model, respectively. In each version of the modified circuit design model, a different subset of latches in the latch set may be unmapped. For example, a first BEC tool execution may be performed between the original circuit design and a first version of the modified circuit design in which a first subset of M latches of the latch set are not mapped, where M is the integer portion of (total number N of latches in the latch set)/2. Similarly, a second BEC tool execution may be performed between the original circuit design and a second version of the modified circuit design in which a second subset of M latches of the latch set are not mapped, and so on until respective BEC tool executions are performed on versions of the modified circuit design for all subsets of the N latches. During such BEC tool executions, each unmapped latch may be treated as an independent variable capable of producing a logic "0" and/or a logic "1" independent of the other latches of the latch set. In this manner, the cumulative results of the plurality of BEC tool executions may indicate whether the voting logic in the modified circuit design functions properly. Thus, the second embodiment may overcome the above-described problem introduced by the traditional mapping. In this manner, the present invention provides improved methods and apparatus for BEC.

Figure 1:
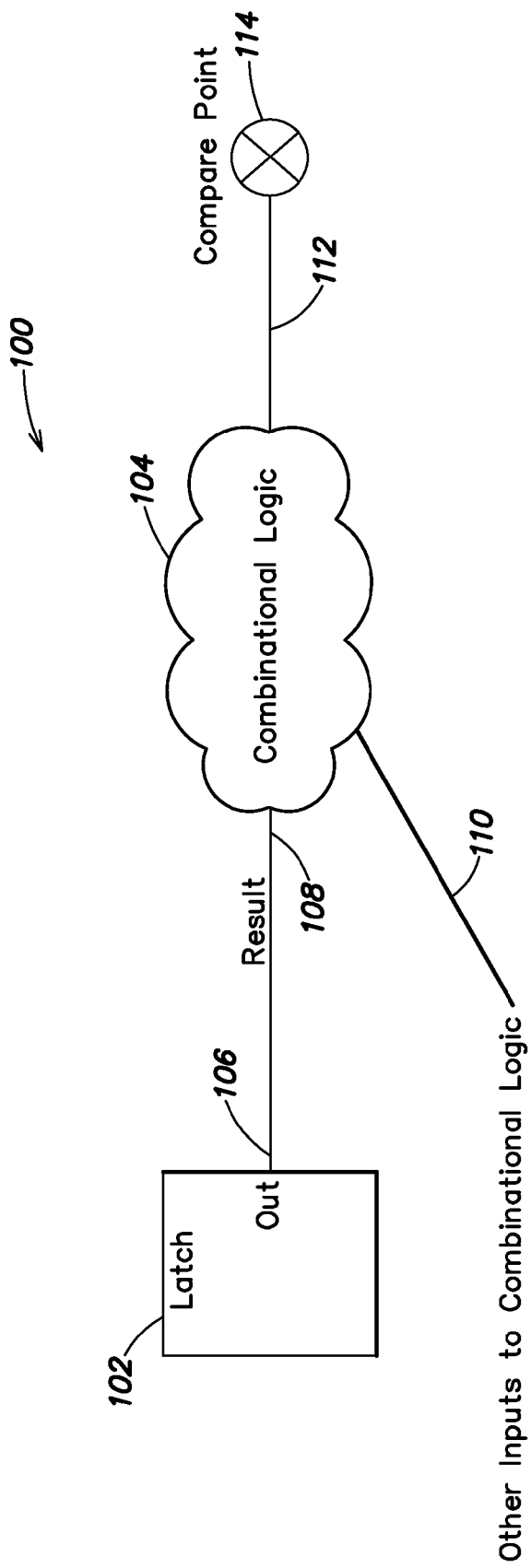
FIG. 1 illustrates a model of an exemplary circuit design including a latch.

FIG. 1 illustrates a model 100 of an exemplary circuit design including a latch. With reference to FIG. 1, the model 100 may include a representation of a latch 102 and combinational logic 104 included in the exemplary circuit design. The representation of the latch 102 may be coupled to the representation of the combinational logic 104. More specifically, an output 106 of the representation of the latch 102 may be coupled to an input 108 of the representation of the combinational logic 104. Therefore, a signal RESULT output from the latch may be input by the combinational logic 104. The representation of the combinational logic 104 may include one or more additional inputs 110 on which data may be received. An output 112 of the combinational logic 104 may serve as a known point (e.g., a compare point) 114. A logic state at the known point 114 may be compared with a similar point on a model of a modified version of the exemplary circuit design.

Figure 2:
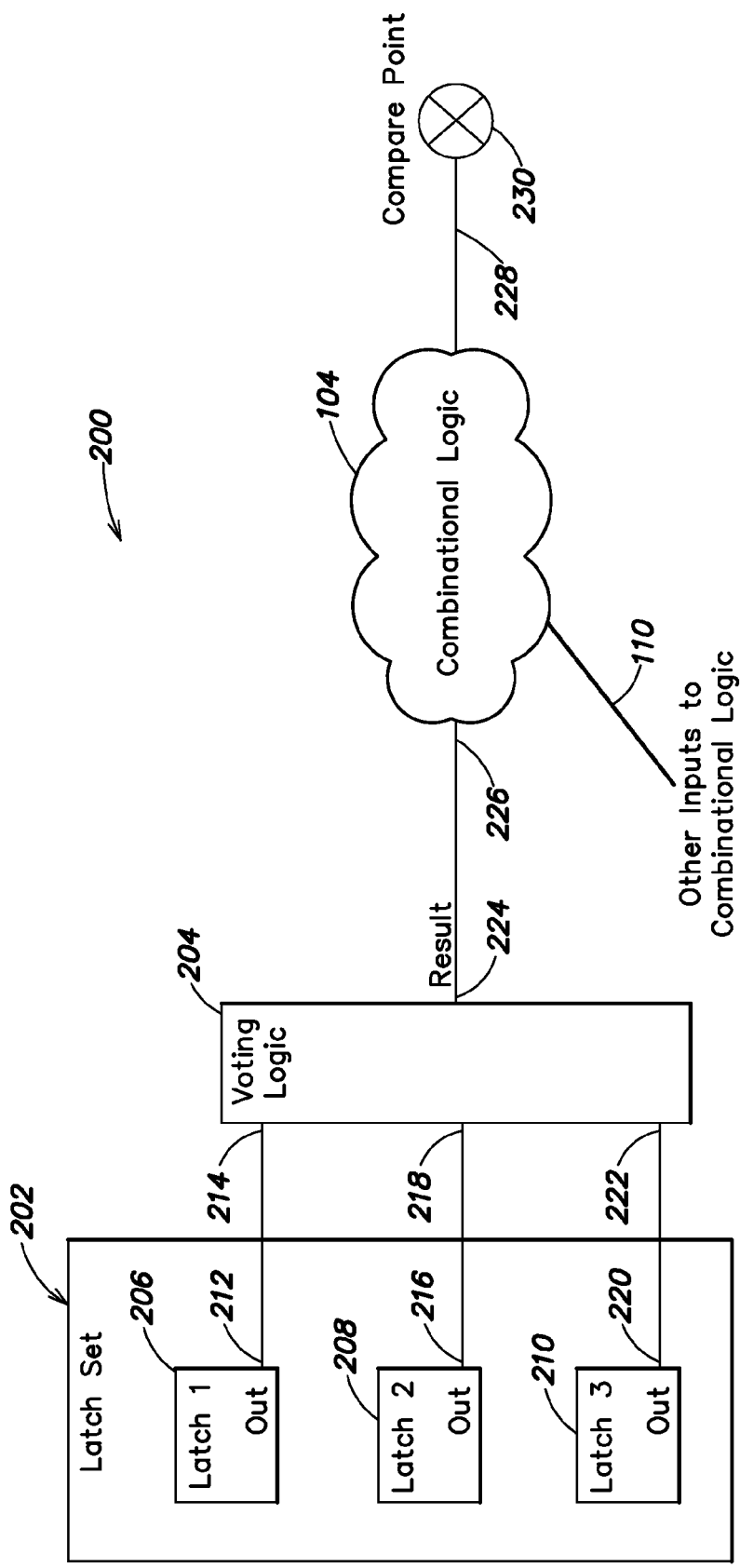
FIG. 2 illustrates a model of a modified version of the exemplary circuit design in which the latch is replaced by a latch set and corresponding voting logic.

FIG. 2 illustrates a model 200 of a modified version of the exemplary circuit design in which the latch is replaced by a latch set and corresponding voting logic. The exemplary circuit design may be modified to include a latch set during a mitigating or hardening process in which a circuit design may be modified to provide increased reliability in environments susceptible to single event upsets. Typically, the circuit design is modified to include an odd number (e.g., usually three) of redundant latches, and therefore, the latch set includes such an odd number of latches. More specifically, such redundancy may be introduced for each latch of the exemplary circuit design that is identified as being significant to correct function of a portion of logic being designed in the exemplary circuit. Such redundancy (e.g., the latch set) in the modified version of the circuit design should be equivalent to the latch of the exemplary circuit design under ideal circumstances. For example, an output of the latch set should appear as a single latched value to any logic downstream from the latch set. To accomplish this and realize the desired redundancy, as described below, outputs of the latch set are fed through a voting or majority function. The odd number of latches in the latch set ensures the voting or majority function may provide a clear winner in the voting process. Assuming the exemplary circuit design is modified to include three redundant latches (e.g., A, B and C), a common implementation of the voting or majority function may be:

good (A, B, C)=(A and B) or (B and C) or (A and C).

A user, such as a circuit designer, may code such redundancy into the design source (e.g., into the VHDL, Verilog or another suitable language employed to create the exemplary circuit design). Alternatively, the user may introduce such redundancy using a logic synthesis technique in which a textual description of a circuit design is mapped into a design including logic circuit elements or another suitable method.

During a circuit design process, an original circuit design may be manipulated in many ways to form the modified version. For example, in response to an Engineering Change Order (ECO), a circuit designer may employ a manual editing tool to create a changed circuit design based on the original circuit design. Additionally or alternatively, a synthesis transform program may be employed to create a changed circuit design that provides some optimization compared to the original circuit design. However, other methods may be employed to create the changed circuit design.

As the design source is thus processed (e.g., changed) as described above, maintaining Boolean equivalency between the original circuit design and the changed circuit design formed by one or more of the above described processes is essential. Therefore, Boolean equivalence checking (BEC) is performed between the original and modified circuit designs to guarantee that no logical functional change has occurred in the changed circuit design. A BEC tool using formal proof methods may be employed to do this checking.

To perform BEC between two design points (e.g., circuit design representations), correspondence or mapping is performed. During correspondence or mapping, respective portions of each of the design points may be divided into corresponding logic cones. The logic cone for each design point may have a set of inputs and at least one output. A problem caused by mapping between a model of a circuit design including a latch and a modified version of the circuit design including a latch set associated with the latch of the circuit design is described below.

With reference to FIG. 2, the model 200 may include a representation of a latch set 202, voting logic 204 and combinational logic 104 included in the modified version of the exemplary circuit design. The latch set 202 may include a plurality of latches. For example, the latch set 202 may include first through third latches 206, 208, 210. The representation of the latch set 202 may be coupled to the representation of the voting logic 204. More specifically, an output 212 of the representation of the first latch 206 of the latch set 202 may be coupled to a first input 214 of the representation of the voting logic 204. Similarly, an output 216 of the representation of the second latch 208 of the latch set 202 may be coupled to a second input 218 of the representation of the voting logic 204 and an output 220 of the representation of a third latch 210 of the latch set 202 may be coupled to a third input 222 of the representation of the voting logic 204. The voting logic 204 may be adapted to output, via an output 224, a value representing the majority value output from the first through third latches 206, 208, 210 of the latch set 202.

The output 224 of the voting logic 204 may be coupled to an input 226 of the representation of the combinational logic 104. Therefore, a signal RESULT output from the voting logic 204 may be input by the combinational logic 104. The representation of the combinational logic 104 may include one or more additional inputs 110 on which data may be received. An output 228 of the combinational logic 104 may serve as a known point (e.g., a compare point) 230. A logic state at the known point 230 may be compared with a similar point on a model of another version of the exemplary circuit design.

However, in the model 200 of the modified version of the exemplary circuit design, representation of all latches 206-210 of the latch set 202 are mapped to the representation of the corresponding latch 102 in the model 100 of the exemplary circuit design. Such process of mapping all members of a latch set included in a second circuit design model to a corresponding single latch included in a first circuit design model is the traditional way of handling the case where the first circuit design model has a single latch and another circuit design model has been processed to introduce a latch set (e.g., if redundancy was added via synthesis processing). Therefore, the representation of each latch 206-210 in the latch set 202 outputs the same value (e.g., the value output by the representation of the corresponding latch 102 in the model 100). More specifically, by doing this type of mapping, all members of the latch set in the second circuit design model will always be observed storing the same value.

Such a correspondence or mapping poses a problem during BEC. Because the representation of all latches 206-210 in the latch set 202 outputs the same value (e.g., a logic "0" or a logic "1"), the model 200 may not fully test function of the voting logic 204. For example, the voting logic 204 may not be tested to determine if the voting logic 204 can correct for an error associated with a single latch of the latch set. Rather, the voting logic 204 will only receive inputs for the two ideal cases, when respective values of a low logic state are output from latches 206-210 of the latch set 202 (e.g., "ABC"="000") or when respective values of a high logic state are output from latches 206-210 of the latch set 202 (e.g., "ABC"="111"), and perform the voting or majority function for such ideal cases. Thus, for such a circuit design model including a three-latch latch set, the voting logic 204 will not be able to test for the remaining six possible cases that should be handled thereby.

Such a deficiency may be a problem if, for example, through mistake or error by a logic synthesis tool or a circuit designer, some manipulation of the circuit design results in a modified circuit design including a latch set and voting logic in which the voting logic is negatively modified. Assume a manipulation of the circuit design results in voting logic that performs the following erroneous function:

bad (A, B, C)=(A and B) or (B and C) or (A or C).

A comparison of the results of the two voting or majority functions, good (A, B, C) and bad (A, B, C), clearly illustrates the errors that can be missed during Boolean equivalency checking by only allowing ideal cases on a latch set. For example, as shown below, the bad (A, B, C) voting or majority function results in errors. Further, some of the correct results of the bad (A, B, C) voting or majority function may be for the wrong reason.

|  | ABC | good( ) | bad( ) |  |
|---|---|---|---|---|
| ideal case: | 000 | 0 | 0 |  |
|  | 001 | 0 | 1 | <<<< erroneous result |
|  | 010 | 0 | 0 |  |
|  | 011 | 1 | 1 |  |
|  | 100 | 0 | 1 | <<<< erroneous result |
|  | 101 | 1 | 1 |  |
|  | 110 | 1 | 1 |  |
| ideal case: | 111 | 1 | 1 |  |

A simulation of all inputs on all gates of the modified version of the circuit design may be employed to verify the absence of such a negative modification of the voting logic 204. The simulation may involve checking for patterns in one or more netlists. Such a simulation requires time and incurs costs (e.g., to produce and implement an environment to confirm that the voting logic 204 does not permute the intent of the circuit design). Therefore, improved methods and apparatus for designing a circuit are desired. An improved BEC may eliminate a need to rerun a simulation on a changed model.

Figure 3:
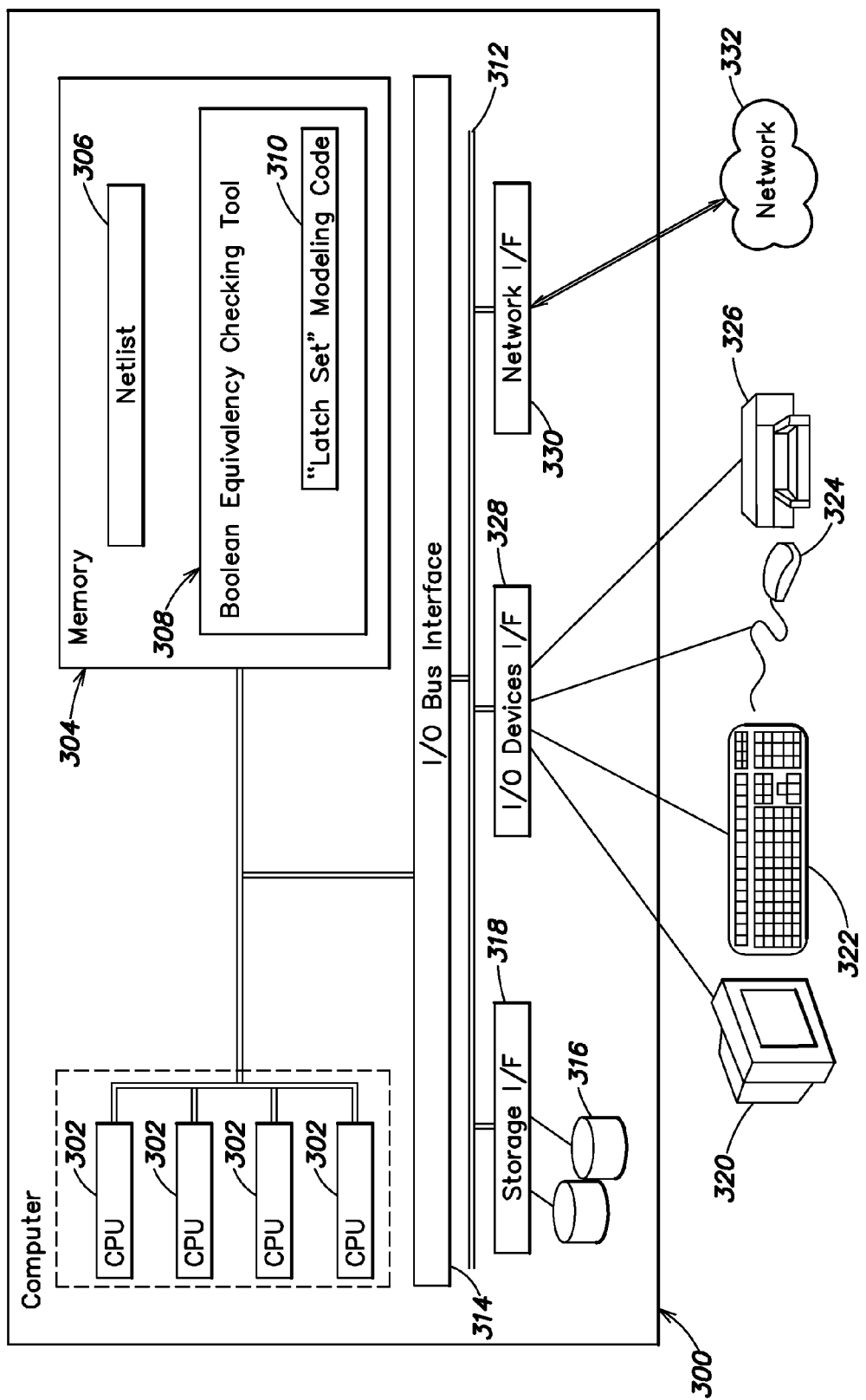
FIG. 3 illustrates a first apparatus for designing a circuit in accordance with an embodiment of the present invention.

FIG. 3 illustrates a first apparatus 300 for designing a circuit in accordance with an embodiment of the present invention. With reference to FIG. 3, the first apparatus 300 may be a computer or similar device. The first apparatus 300 may include one or more processors 302 adapted to execute code. The one or more processors 302 may be coupled to one or more memories 304 (only one shown) adapted to store data. For example, the one or more memories 304 may store one or more netlists 306 (e.g., a first and second netlist). Each netlist 306 may include a list of components and connections to the components included in a circuit design. Further, the one or more memories 304 may store code such as an improved Boolean equivalency checking tool 308 which may be employed to check Boolean equivalence of two circuit designs. In accordance with an embodiment of the present invention, the one or more memories 304 may store latch set modeling code 310. For example, the Boolean equivalency checking (BEC) tool 308 may be modified to include the latch set modeling code 310. The latch set modeling code 310 may be adapted to include error injection logic in a model of a version of an exemplary circuit design on which BEC is performed. The error injection logic is described below with reference to FIG. 4.

The apparatus 300 may also include an input/output (I/O) bus 312 to which the one or more processors 302 and memories 304 are coupled via an (I/O) bus interface 314. Further, the apparatus 300 may include one or more storage devices 316 coupled to the I/O bus 312 via a storage interface 318. Additionally or alternatively, the apparatus 300 may include one or more devices, such as a monitor 320, keyboard 322, mouse 324 and/or printer 326, coupled to the I/O bus 312 via an I/O devices interface 328. Additionally or alternatively, the apparatus 300 may include a network interface 330 through which the apparatus 300 may couple to a network 332. The architecture of the apparatus 300 is exemplary, and therefore, a different architecture may be employed.

Figure 4:
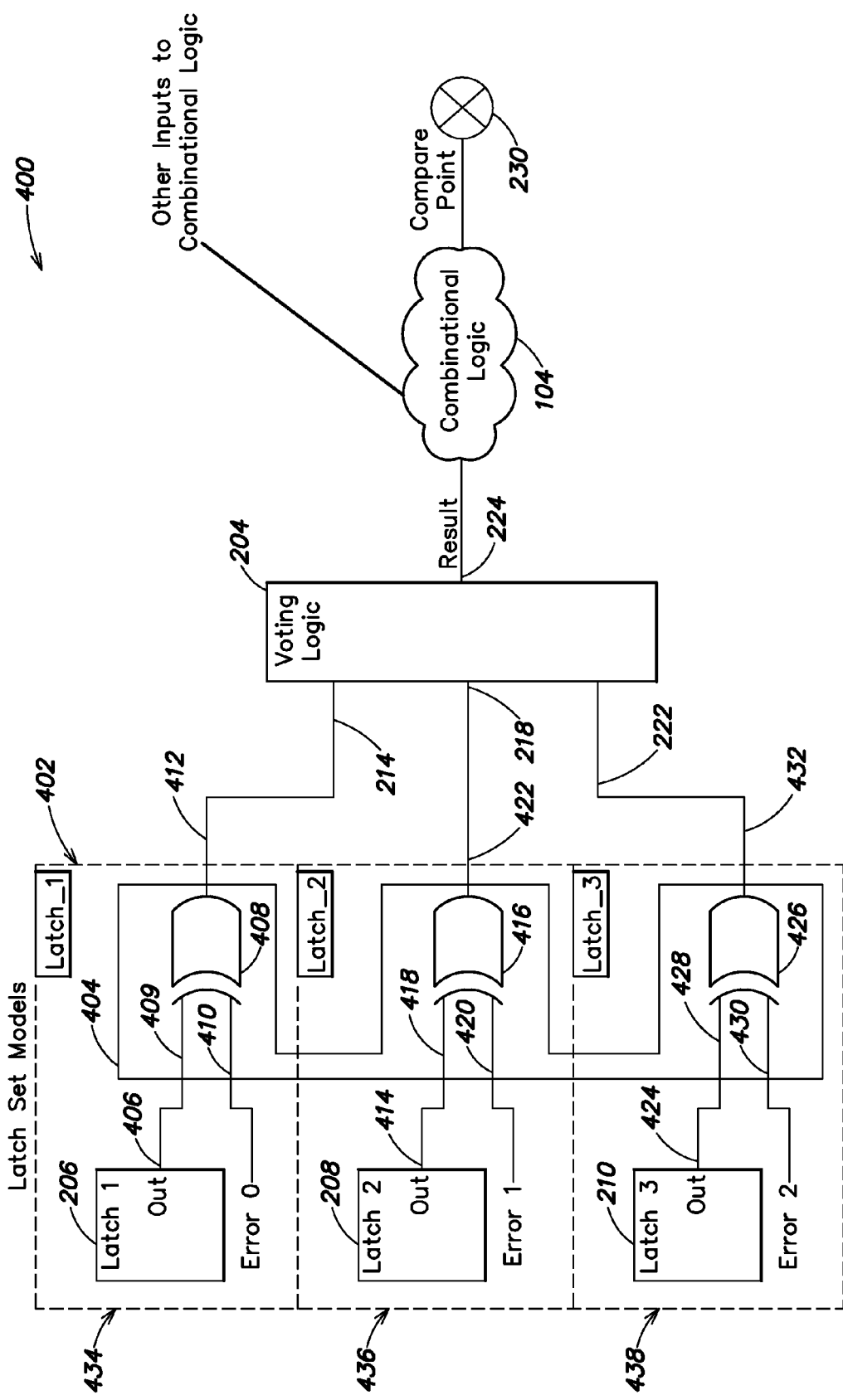
FIG. 4 illustrates a first improved model of the modified version of the exemplary circuit design in which the latch is replaced by the latch set and corresponding voting logic that is created by the first apparatus of FIG. 3 in accordance with an embodiment of the present invention.

FIG. 4 illustrates a first improved model 400 of the modified version of the exemplary circuit design in which the latch is replaced by the latch set and corresponding voting logic that is created by the first apparatus of FIG. 3 in accordance with an embodiment of the present invention. With reference to FIG. 4, the first improved model 400 may be similar to the model 200 of FIG. 2. However, in contrast to the latch set 202 included in the model 200 of FIG. 2, a latch set 402 included in the first improved model 400 may include error injection logic 404. In this manner, a latch set 402 that directly feeds voting logic 204 may be modeled with an error injection capability. For example, the latch set 402 of the first improved model 400 may include a plurality of latches, such as the first through third latches 206-210. Similar to the model 200 of FIG. 2, the representation of all latches 206-210 of the latch set 202 are mapped to the representation of the corresponding latch 102 in the model 100 of the exemplary circuit design. Therefore, the representation of each latch 206-210 in the latch set 402 outputs the same value (e.g., the value output by the representation of the corresponding latch 102 in the model 100). However, an output 406 of the first latch 206 may be coupled to a first logic gate, such as an exclusive-OR gate (XOR gate) 408 included in the error injection logic 404. More specifically, the output 406 of the first latch 206 may be coupled to a first input 409 of the first XOR gate 408. A second input 410 of the first XOR gate 408 may be adapted to receive a first portion (e.g., bit) ERROR 0 of an error signal, which is input by the first XOR gate 408. An output 412 of the first XOR gate 408 may be coupled to the first input 214 of the voting logic 204.

Further, an output 414 of the second latch 208 may be coupled to a second logic gate, such as an XOR gate 416 included in the error injection logic 404. More specifically, the output 414 of the second latch 208 may be coupled to a first input 418 of the second XOR gate 416. A second input 420 of the second XOR gate 416 may be adapted to receive a second portion (e.g., bit) ERROR 1 of the error signal which is input by the second XOR gate 416. An output 422 of the second XOR gate 416 may be coupled to the second input 218 of the voting logic 204.

Similarly, an output 424 of the third latch 210 may be coupled to a third logic gate, such as an XOR gate 426 included in the error injection logic 404. More specifically, the output 424 of the third latch 210 may be coupled to a first input 428 of the third XOR gate 426. A second input 430 of the third XOR gate 426 may be adapted to receive a third portion (e.g., bit) ERROR 2 of the error signal which is input by the third XOR gate 426. An output 432 of the third XOR gate 426 may be coupled to the third input 222 of the voting logic 204.

The combination of the latches 206, 208, 210 and corresponding logic gates 408, 416, 426 may serve to form improved latches 434, 436, 438, respectively. The collection of the improved latches 434, 436, 438 serve to form the latch set 402. Although the representation of each latch 206-210 in the latch set 402 outputs the same value, the error injection logic 404 may be employed to provide respective portions ERROR 0, ERROR 1, ERROR 2 of the error signal to the first through third logic gates 408, 416, 426 such that respective signals output from the improved latches 434, 436, 438 to the voting logic 204, via outputs 412, 422, 432 of the first through third logic gates 408, 416, 426 do not all have the same value (e.g., the value output by the representation of the corresponding latch 102 in the model 100). In this manner, functionality of the voting logic 204 may be tested. More specifically, based on respective logic values at the output 224 of the voting logic 204 and/or at the compare point 230 for a plurality of asserted error signals, functionality of the voting logic 204 may be fully tested.

In this manner, to address the above-described problem in which BEC is unable to fully test the voting logic 204, the first apparatus 300 may employ the BEC tool 308 to assert and inject one or more errors into a mapped latch set 402 of the modified circuit design, and thus onto the inputs 214, 218, 222 of the voting logic 204. As described further below, a number of errors (e.g., simultaneous errors) injected onto latches (e.g., improved latches) 434, 436, 438, respectively, in the latch set 402 should not be such that a majority of latches 434, 436, 438 in the latch set 402 are injected with errors. This may be accomplished by specifying an input constraint to the BEC tool restricting the allowed values on the signals ERROR 0, ERROR 1, and ERROR 2. By injecting one or more errors on the latch set 402 in this manner, the voting logic 204 is forced to resolve logic values presented on inputs 214, 218, 222 of the voting logic 204 to a single value (e.g., a logic "1" or a logic "0") RESULT that represents a majority value of those presented on the inputs 214, 218, 222, and output such value therefrom. In this manner, RESULT may be presented to a representation of logic, such as the combinational logic 104 downstream from the voting logic 204 and appear to such logic 104 as a single driving latch. The BEC tool 308 may employ the single value output from the voting logic 204 or employ the value output from the combinational logic 104 (e.g., the logic state of the compare point 230) to verify that the voting logic 204 has not suffered any negative modifications through error or mistake by logic synthesis tool or the circuit designer. The BEC tool 308 may provide a very fast and thorough check of logic equivalence of the exemplary circuit design model 100 and the modified version 400 of the exemplary circuit design model. Therefore, the BEC tool 308 may save time and cost compared to performing a simulation regression on the modified version 400 of the exemplary circuit design model to check for logic equivalence.

During operation of the first apparatus 300, a method for designing a circuit may be employed to prove functional equivalence for all possible stimuli (e.g., input data) of the two circuit design representations. For example, a model 100 of an original circuit design including a latch may be provided to the BEC tool 308. Further, a model 400 of a modified version of the original circuit design may be created. The modified version of the original circuit design may be formed by modifying the source code of the original circuit design, employing logic synthesis techniques, employing a synthesis transform to optimize the circuit, editing the original circuit design using a manual editing tool in response to an ECO, etc. For example, one or more of the methods above may be employed to form a modified version of the original circuit design that includes a set of latches 402 associated with the latch 102 of the original circuit and voting logic 204 having inputs coupled to respective outputs of latches in the latch set 402. The model 400 of the modified version of the original circuit design may be provided to the BEC tool 308.

The BEC tool 308 may perform BEC to ensure that the modified circuit design is identical in function to the original circuit design. Conventional BEC tools cannot fully test voting logic function of a circuit design including a latch set using traditional mapping techniques. To avoid such a problem, during BEC, the BEC tool 308 may inject an error on at least one of the inputs 214, 218, 222 of the voting logic 204 to test the voting logic function. More specifically, the BEC tool 308 may employ the latch set modeling code 310 to update a model of the modified version of the original circuit to include the error injection logic 404 between the outputs of the latches 206, 208, 210 in the latch set 402 and the inputs 214, 218, 222 of the voting logic 204, thereby forming the improved latches 434, 436, 438. The BEC tool 308 may employ such error injection logic 404 to inject an error on at most M of the respective inputs 214, 218, 222 of the voting logic 204 to test the voting logic function.

More specifically, the set 402 of latches may include N latches, where N is an odd number. The BEC tool 308 may be adapted to determine subsets of the latch set 402. Each subset may be a unique group of M latches of the latch set 402, where M is the integer value resulting from the computation N/2. Therefore, the M latches represent a minority number (e.g., the largest minority number) of latches 434-438 of the latch set 402. Further, M+1 represents a majority number (e.g., the smallest majority number) of latches 434-438 of the latch set 402. To inject an error on one of the respective inputs 214, 218, 222 of the voting logic 204, for each subset, the BEC tool 308 may inject an error on each latch 434, 436, 438 in the subset by allowing assignment of logic '1' to signals ERROR 0, ERROR 1, or ERROR 2, respectively. The BEC tool 308 may test voting logic function by determining a logic value at a point (e.g., the compare point 230) in the model 400 of the modified version of the original circuit design that is downstream from the voting logic 204 in response to different sets of stimuli. The logical function at the point 230 is based on the output of the voting logic 204. For example, for each of the subsets, after injecting an error on each latch 434, 436, 438 in the subset, the BEC tool 308 may determine the logical function at the point (e.g., compare point 230) in the model 400 of the modified version of the original circuit design.

For each of the subsets, a different respective state of a bussed signal may be employed to inject an error on each latch 434, 436, 438 in the subset. For example, assume the latch set 402 includes three latches 434, 436, 438. Therefore, N is 3 and M is 1. Because M is 1, the BEC tool 308 may identify three one-latch subsets. During BEC, for each subset, the BEC tool 308 may inject an error on the latch 434, 436, 438 in the subset. A three-bit bussed error signal ERROR (0:2) may be employed to inject errors as described above. For example, the BEC tool 308 may employ "hot01" constraints of the bussed error signal ERROR (0:2) in which at most a single bit of the error signal is asserted. A constraint may be a means to restrict the allowed logic value assignments to a set of signals. Thus, the "hot01" constraint may restrict the bussed error signal ERROR (0:2) to one or more of the following states: "000", "001", "010" and "100". In other words, bits of the error signal ERROR (0:2) may all be logic "0"s or one and only one of the bits may be a logic "1". A first portion (e.g., the first bit) of the bussed error signal ERROR (0:2) may be applied to the first latch 434, a second portion (e.g., second bit) of the bussed error signal ERROR (0:2) may be applied to the second latch 436 and a third portion (e.g., third bit) of the bussed error signal ERROR (0:2) may be applied to the third latch 438. More specifically, bits of the bussed error signal ERROR (0:2) may be applied to the second inputs 410, 420, 430 of the logic gates 408, 416, 426 (e.g., 2-input XOR gates), respectively. As known to one of skill in the art, when a signal is applied to a first input of a 2-input XOR gate and a logic "0" is applied to a second input of the 2-input XOR gate, the XOR gate functions as a buffer such that a signal applied to the first input of the XOR gate is output from the XOR gate. Alternatively, when a signal is applied to a first input of the 2-input XOR gate and a logic "1" is applied to the second input of the XOR gate, the XOR gate functions as an inverter such that the complement of the signal applied to the first input of the XOR gate is output from the XOR gate. In this manner, the first apparatus 300 may employ the bussed error signal ERROR (0:2) to leverage XOR gate behavior such that an error is injected onto only one latch or no latches in the latch set.

Consequently, the three XOR gates 408, 416, 426 may be employed to (1) buffer a true and valid value stored by each latch 206, 208, 210 such that the values are output from respective outputs 412, 422, 432 of the XOR gates 408, 416, 426 and input by the voting logic 204 via respective inputs 214, 218, 222 for the ideal cases (e.g., by employing a logic "0" for all bits of the bussed error signal ERROR (0:2) such that no errors are inserted); or (2) inject an error on one of the three latches 434, 436, 438 of the latch set 402 (e.g., by employing a logic "1" for only one bit of the bussed error signal ERROR (0:2) applied to the XOR gates 408, 416, 426). The correspondence of the latches 206, 208, 210 in the latch set 402 causes the latches 206, 208, 210 to drive a logic "000" or a logic "111". However, the error injection logic 404 may be employed to inject errors as described above such that all possible signal combinations (e.g., all eight signal combinations) may be output from the XOR gates 408, 416, 426 and observed (e.g., input) by the voting logic 204 during a single execution of the BEC tool. In this manner, the BEC tool 308 may fully test voting logic function in a single execution of the BEC tool. Consequently, the BEC tool 308 may efficiently and accurately prove functional equivalence for all possible stimuli of the two circuit design representations (e.g., the original circuit design model 100 and a modified version thereof 400).

The above scenario is exemplary. Therefore, the method for designing a circuit may be employed for a representation of a circuit design including a different number of latches (e.g., 5 latches). By always employing an odd number of latches in the latch set 402, a minority number of latches may always be formed which is one less than a majority number of latches. Bits of the error signal may be constrained such that 0 to the minority number of bits may be asserted (e.g., a logic "1") at any one time. For example, in the case of the 3-latch latch set described above, a "hot01" constraint is imposed on the error signals such that 0 or 1 bit of the error signals is a logic "1". Therefore, 0 or 1 latch 434, 436, 438 of the latch set 402 may be employed to inject an error into the voting logic 204. Alternatively, in a 5-latch latch set, an error signal constraint may be employed such that 0, 1 or 2 latches of such a 5-latch latch set may be employed to inject an error into the voting logic 204.

Figure 5:
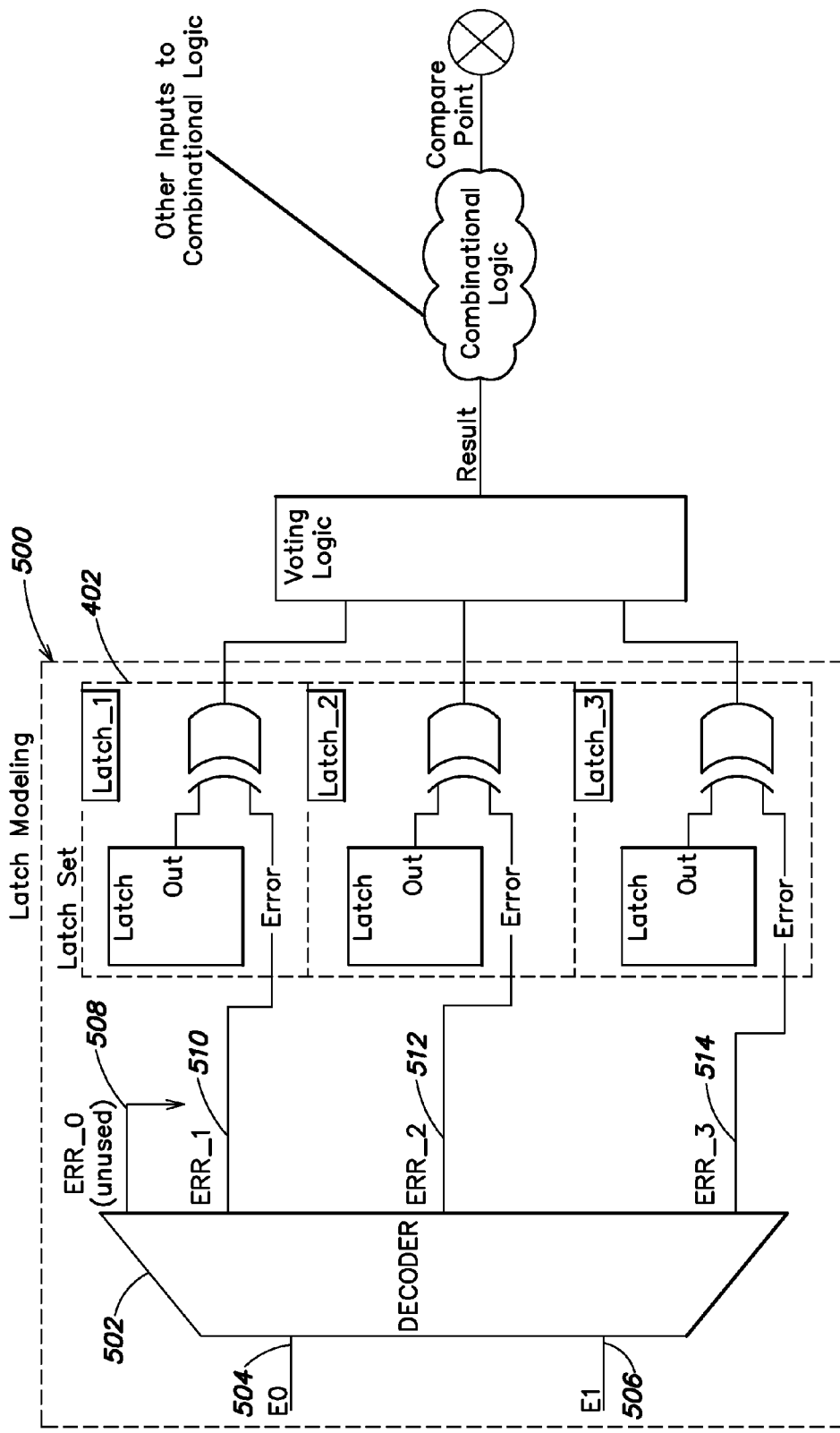
FIG. 5 illustrates a second improved model of the modified version of the exemplary circuit design in which the latch is replaced by the latch set and corresponding voting logic that is created by the first apparatus of FIG. 3 in accordance with an embodiment of the present invention.

FIG. 5 illustrates a second improved model 500 of the modified version of the exemplary circuit design in which the latch 102 is replaced by the latch set 402 and corresponding voting logic 204 that is created by the first apparatus of FIG. 3 in accordance with an embodiment of the present invention. With reference to FIG. 5, the second improved model 500 may include a decoder 502 adapted to create an error signal. For example, the decoder 502 may include first and second inputs 504, 506 on which signals E0, E1 may be received, respectively. Signals E0 and E1 may serve as inputs to the compare point 230 that is tested by the BEC tool 308. The decoder 502 may be adapted to output signals ERR_0, ERR_1, ERR_2, ERR_3, via a first through fourth outputs 508, 510, 512, 514, based on signals E0, E1. Bits ERR_1, ERR_2 and ERR_3 may serve as the error signal applied to the three-latch latch set 402. However, the decoder 502 may be configured in a different manner. For example, the decoder 502 may be adapted to input and/or output a larger or smaller number of bits.

Figure 6:
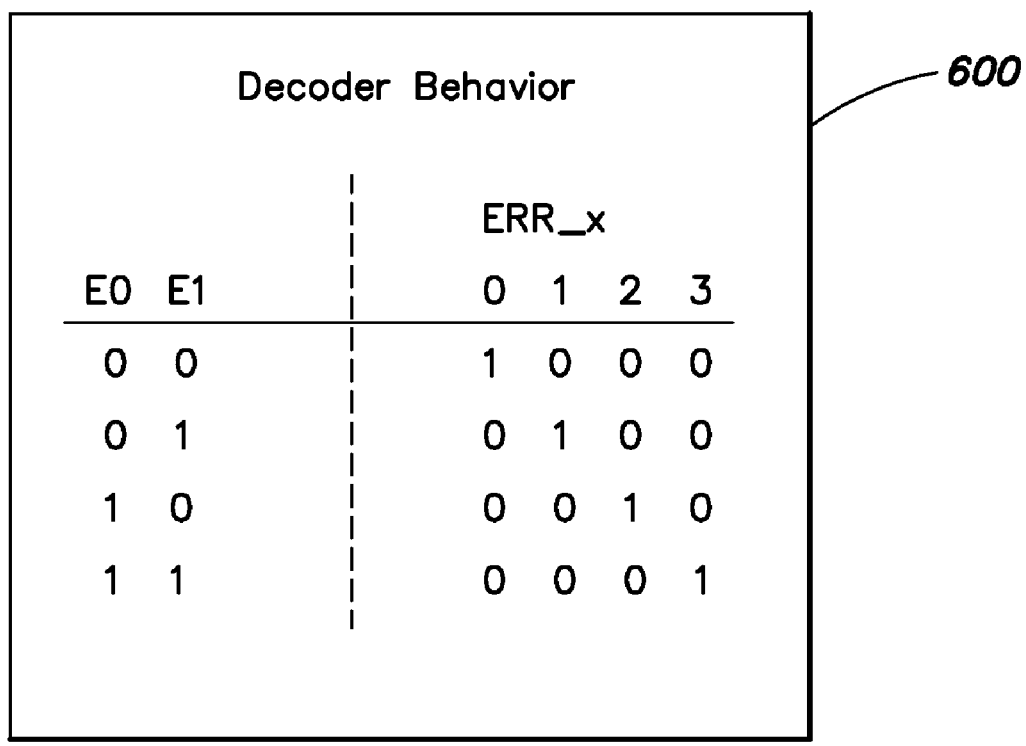
FIG. 6 is a table illustrating behavior of a decoder in the second improved model of FIG. 5 in accordance with an embodiment of the present invention.

FIG. 6 is a table 600 illustrating behavior of a decoder in the second improved model of FIG. 5 in accordance with an embodiment of the present invention. With reference to FIG. 6, when E0 and E1 are logic "0"s, the decoder 502 outputs a signal in which ERR_0 is a logic "1" and remaining bits are logic "0"s. When E0 is a logic "0" and E1 is a logic "1", the decoder 502 outputs a signal in which ERR_1 is a logic "1" and remaining bits are logic "0"s. When E0 is a logic "1" and E1 is a logic "0", the decoder 502 outputs a signal in which ERR_2 is a logic "1" and remaining bits are logic "0"s. Similarly, when E0 and E1 are logic "1"s, the decoder 502 outputs a signal in which ERR_3 is a logic "1" and remaining bits are logic "0"s. In this manner, the BEC tool 308 may receive four possible error signals without relying on a constraint.

Improved methods of BEC using a single execution of the BEC tool is described above with reference to FIGS. 3-6. However, the present invention provides improved methods of BEC using a plurality of BEC tool executions.

Figure 7:
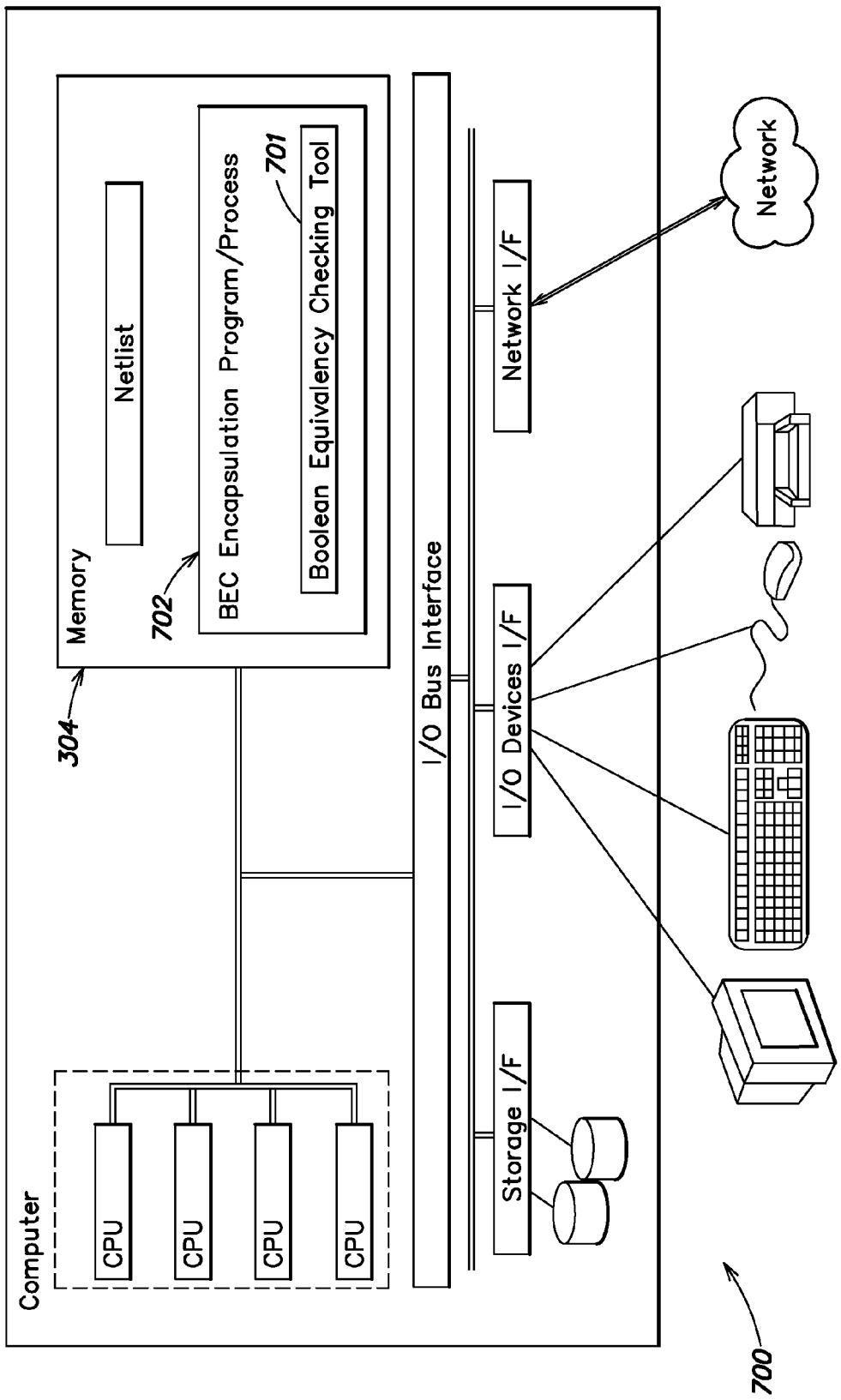
FIG. 7 illustrates a second apparatus for designing a circuit including a BEC tool in accordance with an embodiment of the present invention.

FIG. 7 illustrates a second apparatus 700 for designing a circuit including a BEC tool 701 in accordance with an embodiment of the present invention. With reference to FIG. 7, the second apparatus 700 may be similar to the first apparatus 300. However, in contrast to the first apparatus 300, the second apparatus 700 may include BEC encapsulation program or process 702 (hereinafter "encapsulation program 702") stored in the memory adapted to instruct the BEC tool 701 associated therewith. The BEC tool 701 may be similar to the BEC tool 308 of FIG. 3. However, in contrast to BEC tool 308, the BEC tool 701 may be adapted to ignore unmapped latches in a latch set during BEC as described below. The encapsulation program 702 may be adapted to create mapping files and instruct the BEC tool 701 to perform a plurality of BEC tool executions, wherein the mapping files correspond to the BEC tool executions, respectively. Details of operation of the BEC tool 701 and encapsulation program 702 are described below with reference to FIG. 8.

Figure 8:
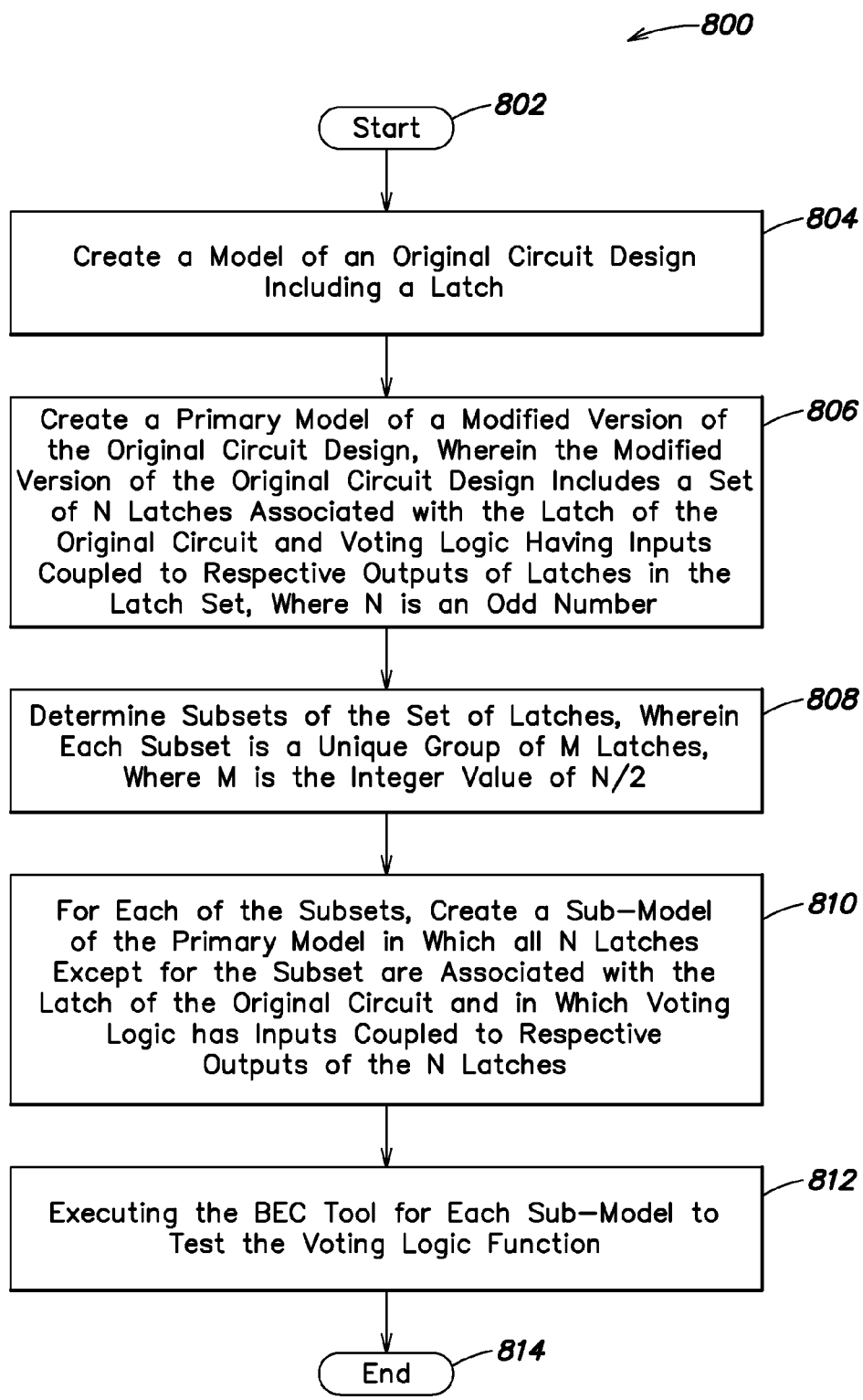
FIG. 8 illustrates a first exemplary method of designing a circuit in accordance with an embodiment of the present invention.

FIG. 8 illustrates a first exemplary method 800 of designing a circuit in accordance with an embodiment of the present invention. With reference to FIG. 8, in step 802, the method 800 begins. In step 804, a model of an original circuit design including a latch may be created. For example, during a circuit design process, a circuit designer may create an original circuit design including a latch. Such an original circuit design may be modeled using VHDL, Verilog or another suitable language. The model of the original circuit design may be similar to the model 100 shown with reference to FIG. 1.

In step 806, a primary model of a modified version of the original circuit design may be created. The modified version of the original circuit design may include a set of N latches associated with the latch of the original circuit and voting logic having inputs coupled to respective outputs of latches in the latch set, where N is an odd number. The modified version of the original circuit design may be similar to the model 200 shown with reference to FIG. 2. The encapsulation program 702 may create a master mapping or correspondence file associated with the primary model of the modified version of the original circuit.

In step 808, subsets of the set of latches may be determined. Each subset may be a unique group of M latches, where M is the integer value of N/2. Therefore, M may be a minority (e.g., the largest minority) number of latches in the latch set. For example, the encapsulation program 702 may determine all possible combinations of such subsets. Therefore, for a 3-latch latch set, three such subsets may be formed.

In step 810, for each of the subsets, a sub-model of the primary model may be created in which all N latches except for the subset are associated with the latch of the original circuit and in which voting logic has inputs coupled to respective outputs of the N latches. Therefore, for a 3-latch latch set, the first through third sub-models may be similar to the model 200 shown with reference to FIG. 2. However, the first sub-model may not associate the first latch 206 with the latch of the original circuit. Similarly, the second sub-model may not associate the second latch 208 with the latch of the original circuit, and the third sub-model may not associate the third latch 210 with the latch of the original circuit. The encapsulation program 702 may determine such sub-models of the primary model. For example, the encapsulation program 702 may create secondary mapping or correspondence files associated with the sub-models, respectively.

In step 812, the execution of the BEC tool may be performed for each sub-model to test the voting logic function. In the example described above, the encapsulation program 702 may cause the BEC tool 701 to perform a first execution of the BEC tool on the first sub-model, a second execution of the BEC tool on the second sub-model, and a third execution of the BEC tool on the third sub-model. During the first execution of the BEC tool, ideal values are assumed for latches 208, 210 of the latch set 202 modeled in the first sub-model. Similarly, during the second execution of the BEC tool, ideal values are assumed for latches 206, 210 of the latch set 202 modeled in the second sub-model, and during the third execution of the BEC tool, ideal values are assumed for latches 206, 208 of the latch set 202 modeled in the third sub-model. The BEC tool 701 may ignore any unmapped latches in a sub-model during BEC. Collectively, the respective BEC tool executions on the sub-models may be employed to fully test operation of the voting logic 204. More specifically, collectively, the BEC tool executions may test voting logic function for all possible signal combinations output from the latches 206, 208, 210 and observed (e.g., input) by the voting logic 204.

Through use of the method 800, the encapsulation program 702 and BEC tool 701 may provide a very fast and thorough check of logic equivalence of the exemplary circuit design model and the modified version of the exemplary circuit design model. Therefore, the encapsulation program 702 and BEC tool 701 may save time and cost compared to performing a simulation regression on the modified version of the exemplary circuit design model to check for logic equivalence.

Figure 9:
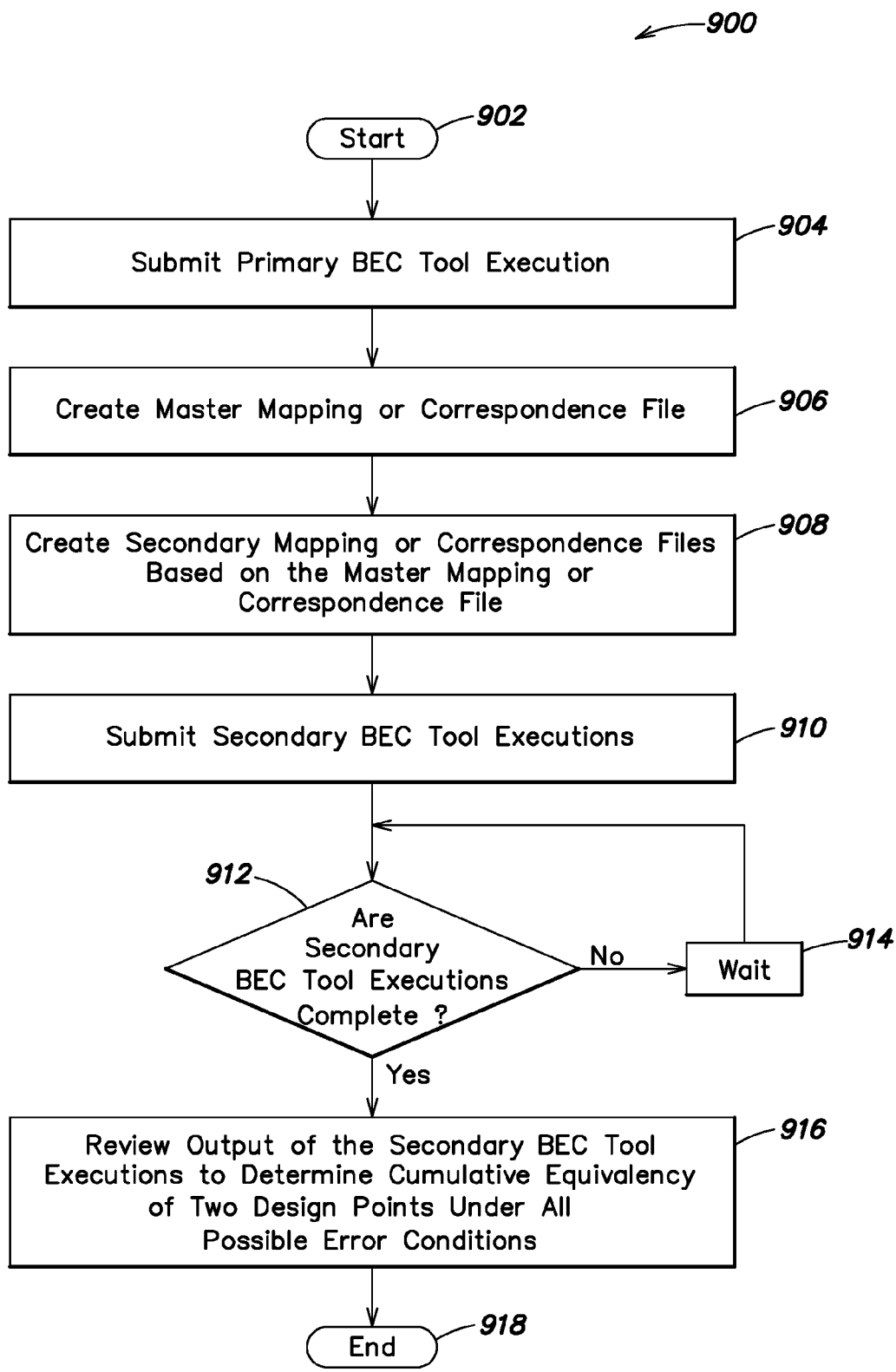
FIG. 9 illustrates a second exemplary method of designing a circuit in accordance with an embodiment of the present invention.

FIG. 9 illustrates a second exemplary method 900 of designing a circuit in accordance with an embodiment of the present invention. The second exemplary method 900 may be a more detailed version of the first exemplary method 800. With reference to FIG. 9, in step 902, the method 900 begins. In step 904, a primary execution of the BEC tool may be submitted. The primary execution of the BEC tool may be based on a model 200 of an original circuit design including a latch 102 which has been modified to include a set of N latches 206, 208, 210 associated with the latch 102 of the original circuit design and voting logic 204 having inputs 214, 218, 222 coupled to respective outputs 212, 216, 220 of latches 206, 208, 210 in the latch set 202, where N is an odd number. For example, the encapsulation program 702 may input a model 200 of the modified version of the original circuit design to the BEC tool 701. In step 906, a master mapping or correspondence file may be created. For example, the BEC tool 701 may create the master mapping or correspondence file. The master mapping or correspondence file may be associated with the modified version of the original circuit design. For example, in the master mapping files, all latch sets 202 are completely mapped. One record may be created for each latch set 202. The BEC tool 701 may not perform a verification of the mapping of the model 200 of the modified version of the original circuit. More specifically, the BEC tool 701 may not prove functional equivalence of the original circuit and the modified version of the original circuit. In some embodiments, the primary execution of the BEC tool may terminate.

In step 908, secondary mapping or correspondence files may be created based on the master mapping or correspondence file. The BEC tool 701 may process the master mapping or correspondence file to create the secondary mapping or correspondence files. A text processing language script, such as Perl, TCL or the like, may be employed to process the master correspondence file to create the secondary mapping or correspondence files. Each secondary mapping or correspondence file may include a mapping of all N latches 206, 208, 210 in the latch set 202 except for a unique subset of M latches, where M may be the integer portion of N/2. For the example above in which a 3-latch latch set is employed, three secondary mapping or correspondence files may be created. A first secondary mapping or correspondence file may include a mapping of the second and third latches 208, 210 of the latch set 202. Similarly, a second secondary mapping or correspondence file may include a mapping of the first and third latches 206, 210 in the latch set 202, and the third secondary mapping or correspondence file may include a mapping of the first and second latches 206, 208 of the latch set 202. To wit, each new secondary mapping file has M of the latches 206, 208, 210 from a corresponding latch set 202 (e.g., significant latch set) removed. A significant latch set may refer to a latch set that directly drives the voting logic 204. For example, a DQ-flip flop may be a significant latch. Further, the slave latch of a master/slave (SRL) latch may be a significant latch.

In step 910, the secondary execution of the BEC tools may be submitted. For the 3-latch latch set 202, three secondary BEC tool executions may be submitted. As described above, for the 3-latch latch set 202, a different single latch may be excluded from each respective secondary mapping file. The exclusion of such a latch in the secondary mapping file may introduce an independent variable that is presented to the voting logic 204 for each submitted secondary execution of the BEC tool. During the execution of the BEC tool associated with a secondary mapping file, mapped latches 206, 208, 210 will be tested for the ideal case. For example, the two latches mapped in a secondary mapping file may both output a logic "1" or a logic "0" during the secondary execution of the BEC tool associated therewith. Thus, the mapped latches of the latch set 202 may output a "00" or "11". Further, during such BEC tool execution, the unmapped latch may output a logic "0" and/or a logic "1". As a result, during such secondary execution of the BEC tool, non-ideal cases (e.g., "001", "110" and/or the like) may be input by the voting logic 204. Consequently, the voting logic 204 may be forced to resolve such non-ideal cases and output a majority value.

The BEC tool 701 may perform verification on each secondary execution of the BEC tool to prove functional equivalence of the original circuit design and the modified version of the original circuit design. Each secondary execution of the BEC tool may be pointed to its associated mapping or correspondence file. As stated, the BEC tool 701 may be adapted to ignore any unmapped latches in the secondary mapping file. For example, the encapsulation program 702 may instruct the BEC tool 701 to ignore any unmapped latches while performing BEC on a sub-model. In this manner, the BEC tool 701 may allow a partial correspondence or mapping during BEC. Consequently, verification may be performed on a file including a partial mapping or correspondence. If the BEC tool 701 is not adapted in this manner, the BEC tool 701 may never reach the verification phase. The cumulative verification performed by the three secondary BEC tool executions may test for all possible signal combinations that may be output from the latch set 202 and input by the voting logic 204. The BEC tool 701 may report any detected errors. Such information may be employed during a verification step (described below) to ensure the voting logic 204 has not been negatively changed in the model 200 of the modified version of the original circuit design.

In step 912, it is determined whether the secondary BEC tool executions are complete. If, in step 912, it is determined that the secondary BEC tool executions are not complete, step 914 is performed. In step 914, the BEC tool 701 waits a predetermined time period. Thereafter, step 912 is performed again.

Alternatively, if, in step 912, it is determined the secondary BEC tool executions are complete, step 916 is performed. In step 916, the output of the secondary BEC tool executions may be reviewed to determine cumulative equivalency of two design points under all possible error conditions. For example, the BEC tool 701 may process the results of all of the secondary BEC tool executions to determine whether the voting logic 204 functions properly.

Thereafter, step 918 may be performed. In step 918, the method 900 ends. While the method 900 is described with reference to a 3-latch latch set 202 and three-input voting logic 204 employed for circuit design hardening. The present methods and apparatus may include a larger odd number of latches in the latch set and/or a larger number of voting gates which may perform the voting or majority function (e.g., the voting logic 204 may be adapted to include a larger number of inputs). The number of latches to exclude per secondary BEC tool execution may be calculated by (N−1)/2 (e.g., effectively taking the integer portion of the N latches per latch set 202 divided by 2), which will always yield 1 less than (e.g., or 1 off) a majority number (e.g., the smallest majority number) of N redundant latches. Therefore, the majority number of latches from the latch set may drive the voting logic to what should be the correct result.

More specifically, through use of the present method 900, the encapsulation program 702 and BEC tool 701 may provide a very fast and thorough check of logic equivalence of the exemplary circuit design model 100 and the modified version 200 of the exemplary circuit design model by employing secondary mapping files in which a minority number M of the N latches are unmapped. M may be the integer portion of N/2. More specifically, multiple BEC tool executions may be submitted against the designs being Boolean equivalency checked. Each BEC tool execution may adjust the mapping of the latch sets in the model of modified version of the original circuit to always exclude the minority number M of latches from the mapped latch set such that a majority number (e.g., N/2+1) of latches are mapped. To wit, each execution of the BEC tool may exclude a different respective set of M latches from the latch set where M may be 1 less than a majority of latches necessary to reach a valid voting result. The majority number N/2+1 of mapped latches may drive the voting logic 204 to the correct result. Therefore, the encapsulation program 702 and BEC tool 701 may save time and cost compared to performing a simulation regression on the modified version of the exemplary circuit design model to check for logic equivalence. The number of secondary BEC tool executions that should be submitted to fully test the voting logic 204 may be determined by the following combination formula:

$$C(r, n) = n!/(r!*(n-r)!)$$

where n is the number of latches included in the latch set and r is the number of latches excluded from the latch set mapping in a sub-model. So for the example in which a 3-latch latch set is coupled to triple-input voting logic, one latch may be excluded in each secondary mapping file. Therefore, three secondary BEC tool executions may be required to fully test voting logic function (e.g., $C(1, 3)=3!/(1!*(3−1)!)=3$). Similarly, for a 5 member voting scheme (e.g., in which a 5-latch latch set is coupled to five-input voting logic), ten secondary BEC tool executions may be required to fully test voting logic function (e.g., $C(2, 5)=5!/(2!*(5−2)!)=10$).

The foregoing description discloses only exemplary embodiments of the invention. Modifications of the above disclosed apparatus and methods which fall within the scope of the invention will be readily apparent to those of ordinary skill in the art. For instance, although a specific voting or majority function is described above, a different voting or majority function may be employed. The present methods and apparatus may be useful in aerospace and defense, mitigated technology libraries and/or similar applications which require performing BEC between an original circuit design and a modified version of the original circuit.

Accordingly, while the present invention has been disclosed in connection with exemplary embodiments thereof, it should be understood that other embodiments may fall within the spirit and scope of the invention, as defined by the following claims.

The invention claimed is:

1. A method of designing a circuit, comprising:
providing a model of an original circuit design including a latch;
providing a model of a modified version of the original circuit design, wherein the modified version of the original circuit design includes a set of latches associated with the latch of the original circuit design and voting logic having inputs coupled to respective outputs of latches in the latch set and having outputs coupled to combinational logic, the set of latches including N latches, where N is an odd number;
determining subsets of the set of latches, wherein each subset is a unique group of M latches, where M is the integer value of N/2;
during Boolean equivalency checking (BEC), injecting an error on at most a largest minority of the inputs of the voting logic to test the voting logic function wherein injecting an error on at most M of the respective inputs of the voting logic includes, for each of the subsets, injecting an error on each latch in the subset; and
for each of the subsets, after injecting an error on each latch in the subset, testing the voting logic by determining a logical function at a point of the modified version of the original circuit that is downstream from the voting logic, wherein such logical function is based on the output of the voting logic.

2. The method of claim 1 further comprising testing the voting logic by determining the logical function at a point of the modified version of the original circuit that is downstream from the voting logic, wherein such logical function is based on the output of the voting logic.

3. The method of claim 1 wherein injecting an error on at most a largest minority of the respective inputs of the voting logic includes:
updating the modified version of the original circuit to include error injection logic between the outputs of the latches in the latch set and the inputs of the voting logic; and employing the error injection logic to inject an error on at most a largest minority of the respective inputs of the voting logic to test the voting logic function.

4. The method of claim 1 wherein injecting an error on at most a largest minority of the respective inputs of the voting logic during BEC includes injecting an error on at most a largest minority of the respective inputs of the voting logic during a single BEC tool execution.

5. An apparatus for designing a circuit, comprising:
a computer having:
  a memory;
  improved Boolean equivalency checking (BEC) code stored in the memory; and
  a processor coupled to the memory and adapted to execute the improved BEC code;
wherein the improved BEC code is adapted to:
  receive a model of an original circuit design including a latch;
  receive a model of a modified version of the original circuit design, wherein the modified version of the original circuit design includes a set of latches associated with the latch of the original circuit design and voting logic having inputs coupled to respective outputs of latches in the latch set and having outputs coupled to combinational logic; the set of latches including N latches, where N is an odd number;
  determine subsets of the set of latches, wherein each subset is a unique group of M latches and where M is the integer value of N/2;
  during Boolean equivalency checking (BEC), inject an error on at most a largest minority of the respective inputs of the voting logic to test the voting logic function, for each of the subsets, injecting an error on each latch in the subset; and
  for each of the subsets, after injecting an error on each latch in the subset, testing the voting logic by determining a logical function at a point of the modified version of the original circuit that is downstream from the voting logic, wherein such logical function is based on the output of the voting logic.

6. The apparatus of claim 5 wherein the improved BEC code is further adapted to test the voting logic by determining a logical function at a point of the modified version of the original circuit that is downstream from the voting logic, wherein such logical function is based on the output of the voting logic.

7. The apparatus of claim 5 wherein the improved BEC code is further adapted to:
  update the modified version of the original circuit design to include error injection logic between the outputs of the latches in the latch set and the inputs of the voting logic; and
  employ the error injection logic to inject an error on at most a largest minority of the respective inputs of the voting logic to test the voting logic function.

8. The apparatus of claim 5 wherein the improved BEC code is further adapted to inject an error on at most a largest minority of the respective inputs of the voting logic during a single BEC tool execution.

* * * * *